United States Patent
Park et al.

(10) Patent No.: US 11,017,951 B2
(45) Date of Patent: May 25, 2021

(54) MULTILAYER ELECTRONIC COMPONENT

(71) Applicant: SAMSUNG ELECTRO-MECHANICS CO., LTD., Suwon-si (KR)

(72) Inventors: Heung Kil Park, Suwon-si (KR); Se Hun Park, Suwon-si (KR); Gu Won Ji, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 40 days.

(21) Appl. No.: 16/441,709

(22) Filed: Jun. 14, 2019

(65) Prior Publication Data

US 2020/0051746 A1 Feb. 13, 2020

(30) Foreign Application Priority Data

Aug. 7, 2018 (KR) .......................... 10-2018-0091864

(51) Int. Cl.
  *H01G 4/248* (2006.01)
  *H01G 4/30* (2006.01)
  *H01G 4/12* (2006.01)
  *H01G 4/012* (2006.01)

(52) U.S. Cl.
  CPC .............. *H01G 4/30* (2013.01); *H01G 4/012* (2013.01); *H01G 4/1218* (2013.01); *H01G 4/248* (2013.01)

(58) Field of Classification Search
  None
  See application file for complete search history.

(56) References Cited

U.S. PATENT DOCUMENTS

| | | | |
|---|---|---|---|
| 10,192,686 B1 * | 1/2019 | Park | H01G 4/30 |
| 10,347,425 B2 * | 7/2019 | Park | H05K 1/181 |
| 2013/0284507 A1 * | 10/2013 | Hattori | H05K 1/181 |
| | | | 174/260 |

(Continued)

FOREIGN PATENT DOCUMENTS

| CN | 103489631 A | 1/2014 |
|---|---|---|
| CN | 104064355 A | 9/2014 |

(Continued)

OTHER PUBLICATIONS

Office Action issued in Korean Patent Application No. 10-2018-0091864 dated Jun. 19, 2019, with English translation.

(Continued)

*Primary Examiner* — Dion Ferguson
(74) *Attorney, Agent, or Firm* — Morgan, Lewis & Bockius LLP

(57) ABSTRACT

A multilayer electronic component includes a capacitor body including a plurality of dielectric layers and a plurality of first and second internal electrodes, and having first to sixth surfaces; first and second external electrodes including first and second connection portions and first and second band portions, respectively; and first and second connection terminals disposed on the first and second band portions on the first surface of the capacitor body. The first and second connection terminals are each provided with a solder receiving portion to have a symmetrical shape in a direction connecting the third and fourth surfaces and a direction connecting the fifth and sixth surfaces.

14 Claims, 5 Drawing Sheets

(56) References Cited

U.S. PATENT DOCUMENTS

| | | | |
|---|---|---|---|
| 2013/0329389 A1 | 12/2013 | Hattori et al. | |
| 2014/0016242 A1 | 1/2014 | Hattori et al. | |
| 2014/0041914 A1* | 2/2014 | Hattori | H01G 2/065 |
| | | | 174/260 |
| 2014/0284089 A1 | 9/2014 | Hattori et al. | |
| 2015/0041195 A1* | 2/2015 | Ahn | H05K 1/0306 |
| | | | 174/260 |
| 2015/0206661 A1 | 7/2015 | Fujimura et al. | |
| 2016/0007446 A1* | 1/2016 | Ishikawa | H01G 4/30 |
| | | | 174/260 |
| 2016/0093441 A1* | 3/2016 | Ahn | H01G 4/1227 |
| | | | 174/260 |
| 2016/0217926 A1* | 7/2016 | Jun | H01G 4/228 |
| 2019/0103223 A1* | 4/2019 | Park | H01G 4/30 |
| 2019/0252121 A1* | 8/2019 | Park | H01G 2/065 |
| 2019/0326059 A1* | 10/2019 | Park | H01G 4/232 |
| 2019/0341189 A1* | 11/2019 | Park | H01G 4/30 |

FOREIGN PATENT DOCUMENTS

| | | |
|---|---|---|
| CN | 104795241 A | 7/2015 |
| JP | 2012-204572 A | 10/2012 |
| JP | 5888281 B2 | 2/2016 |
| KR | 10-2015-0127965 A | 11/2015 |
| KR | 10-2016-0037482 A | 4/2016 |
| KR | 10-2016-0090589 A | 8/2016 |

OTHER PUBLICATIONS

First Office Action issued in corresponding Chinese Patent Application No. 201910715098.1 dated Feb. 1, 2021, with English translation.

* cited by examiner

MULTILAYER ELECTRONIC COMPONENT

CROSS-REFERENCE TO RELATED APPLICATION(S)

This application claims benefit of priority to Korean Patent Application No. 10-2018-0091864 filed on Aug. 7, 2018 in the Korean Intellectual Property Office, the disclosure of which is incorporated herein by reference in its entirety.

BACKGROUND

1. Field

The present disclosure relates to a multilayer electronic component.

2. Description of Related Art

As a multilayer electronic component, a multilayer capacitor is made of a dielectric material, and since the dielectric material has piezoelectric properties, it may be deformed in synchronization with an applied voltage.

When a period of the applied voltage is within an audible frequency band, a displacement is oscillated and transmitted to a substrate through a solder, such that the vibrations of the substrate may be audible. These sounds are known as acoustic noise.

When an operating environment of an apparatus is quiet, such acoustic noise may be perceived by a user as an abnormal sound and may be perceived as a fault of an apparatus.

In addition, in an apparatus having an acoustic circuit, the acoustic noise may be superimposed on an audio output, thereby deteriorating the quality of the apparatus.

In addition, apart from the acoustic noise recognized by a human ear, when piezoelectric vibrations of the multilayer capacitor occur in a high frequency range of 20 kHz or more, it may cause malfunctioning of various sensors used in IT and industrial/electric fields.

SUMMARY

An aspect of the present disclosure is to provide a multilayer electronic component capable of reducing acoustic noise and high frequency vibrations of 20 kHz or more.

According to an aspect of the present disclosure, a multilayer electronic component may include: a capacitor body including a plurality of dielectric layers and a plurality of first and second internal electrodes alternately disposed with the dielectric layer interposed therebetween, and having first and second surfaces opposing each other, third and fourth surfaces connected to the first and second surfaces and opposing each other, and fifth and sixth surfaces connected to the first and second surfaces, connected to the third and fourth surfaces and opposing each other, one ends of the first and second internal electrodes being exposed through the third and fourth surfaces, respectively; first and second external electrodes including first and second connection portions disposed on the third and fourth surfaces of the capacitor body, respectively, and first and second band portions extending from the first and second connection portions to a portion of the first surface of the capacitor body, respectively; and first and second connection terminals disposed on the first and second band portions on the first surface of the capacitor body, respectively, the first and second connection terminals respectively being formed with a solder receiving portion to have a symmetrical shape in a direction connecting the third and fourth surfaces and a direction connecting the fifth and sixth surfaces, respectively.

In an exemplary embodiment in the present disclosure, the first and second connection terminals may include first and second solder receiving portions formed on both surfaces opposing each other in a direction connecting the third and fourth surfaces of the capacitor body, respectively, and third and fourth solder receiving portions on both surfaces facing each other in a direction connecting the third and fourth surfaces of the capacitor body, respectively.

In an exemplary embodiment in the present disclosure, the first and second connection terminals may be formed to have a rectangular shape, and solder receiving portions may be further formed in four corners, respectively.

In an exemplary embodiment in the present disclosure, the first and second connection terminals may further include first and second space portions respectively formed therein.

In an exemplary embodiment in the present disclosure, the first and second connection terminals may include first and second space portions respectively formed therein; a first cutout portion formed in the first solder receiving portion such that a portion of the first space portion is exposed; and a second cutout portion formed in the second solder receiving portion such that a portion of the second space portion is exposed.

In an exemplary embodiment in the present disclosure, the multilayer electronic component may be formed in a position corresponding to others thereof in a direction in which the first cutout portion and the second cutout portion connect the fifth and sixth surfaces of the capacitor body.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
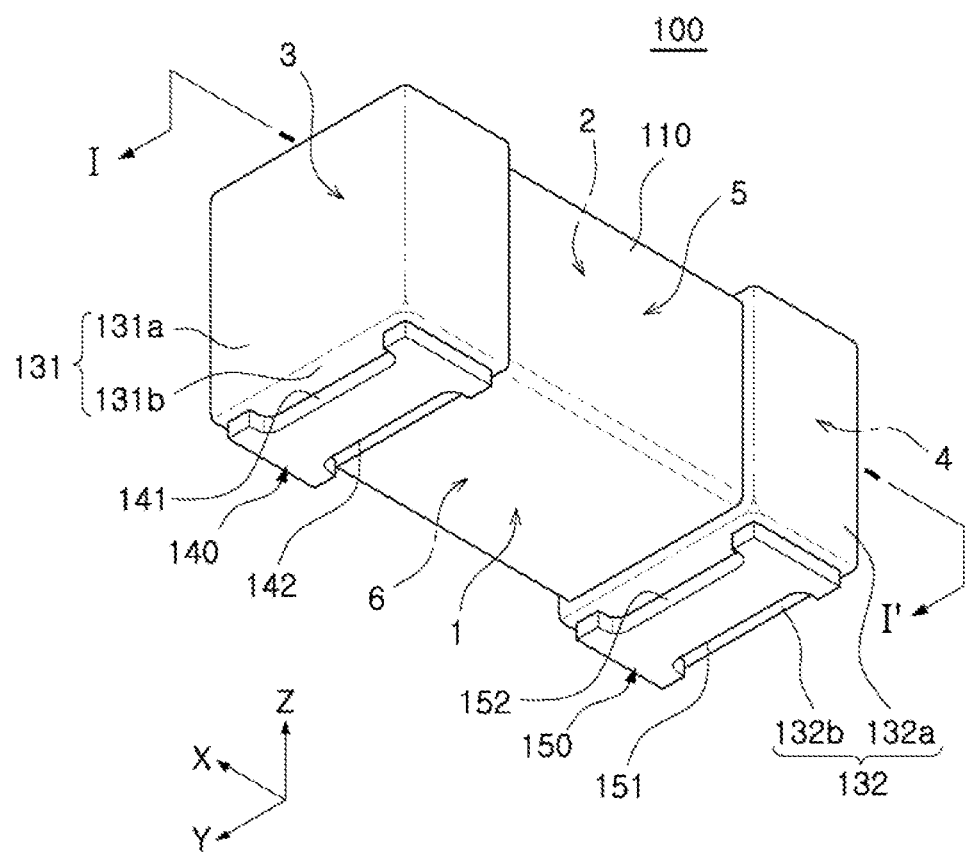
FIG. 1 is a perspective view illustrating a multilayer electronic component according to an exemplary embodiment in the present disclosure.

Hereinafter, exemplary embodiments of the present disclosure will be described in detail with reference to the accompanying drawings.

The present disclosure may, however, be exemplified in many different forms and should not be construed as being limited to the specific embodiments set forth herein.

Rather, these embodiments are provided so that this disclosure will be thorough and complete, and will fully convey the scope of the disclosure to those skilled in the art.

In the drawings, the shapes and dimensions of elements may be exaggerated for clarity.

Further, in the drawings, elements having the same functions within the same scope of the inventive concept will be designated by the same reference numerals.

Throughout the specification, when a component is referred to as "comprise" or "comprising," it means that it may include other components as well, rather than excluding other components, unless specifically stated otherwise.

Figure 2A:
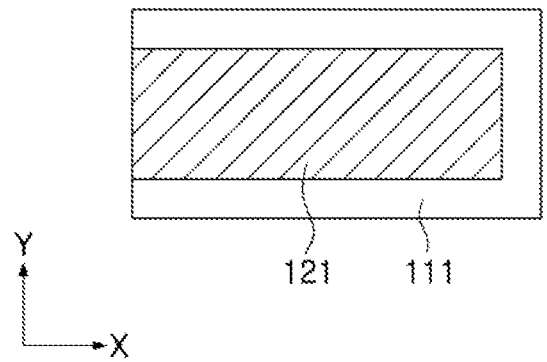
FIGS. 2A and 2B are plan views illustrating first and second internal electrodes of a multilayer electronic component according to an exemplary embodiment in the present disclosure, respectively.
Figure 2B:
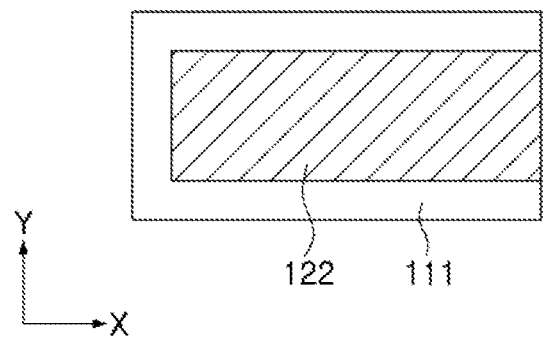
Figure 3:
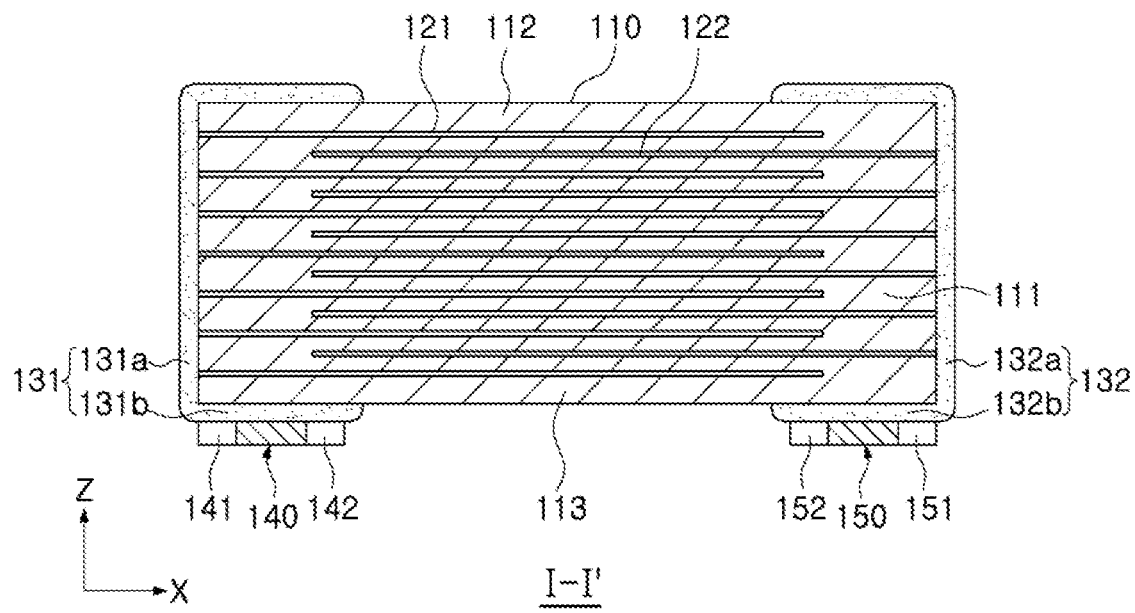
FIG. 3 is a cross-sectional view taken along the line I-I' in FIG. 1.

FIG. 1 is a perspective view illustrating a multilayer electronic component according to an exemplary embodiment in the present disclosure, FIGS. 2A and 2B are plan views illustrating first and second internal electrons of a multilayer electronic component according to an exemplary embodiment in the present disclosure, and FIG. 3 is a cross-sectional view taken along the line I-I' of FIG. 1.

Referring to FIGS. 1 to 3, a multilayer electronic component 100 according to an exemplary embodiment in the present disclosure includes a capacitor body 110, first and second external electrodes 131 and 132, and first and second connection terminals 140 and 150.

Hereinafter, when a direction of the capacitor body 110 is defined to clearly explain an exemplary embodiment in the present disclosure, X, Y, and Z shown in the figures represent a longitudinal direction, a width direction and a thickness direction of the capacitor body 110, respectively. Further, in the present exemplary embodiment, the thickness direction may be used in the same concept as a lamination direction in which the dielectric layers are laminated.

The capacitor body 110 may be formed by laminating a plurality of dielectric layers 111 in the Z direction and then sintering the plurality of dielectric layers 111. The capacitor body 110 may include a plurality of dielectric layers 111 and a plurality of first and second internal electrodes 121 and 122 alternately disposed with the dielectric layers 111 interposed therebetween in the Z direction.

And, cover layers 112 and 113 having a predetermined thickness may be formed on both sides of the capacitor body 110 in the Z direction.

At this time, dielectric layers 111, adjacent to each other in the capacitor body 110, may be integrated such that boundaries therebetween may not be confirmed with the naked eye.

The capacitor body 110 may have a generally hexahedral shape, but the present disclosure is not limited thereto.

In the present exemplary embodiment, for convenience of explanation, both surfaces of the capacitor body 110 opposing each other in the Z direction are defined as first and second surfaces 1 and 2, both surfaces connected to the first and second surfaces 1 and 2 and opposing each other in the X direction are defined as third and fourth surfaces 3 and 4, and both surfaces connected to the first and second surfaces 1 and 2, connected to the third and fourth surfaces 3 and 4 and opposing each other in the Y direction are defined as fifth and sixth surfaces 5 and 6. In the present exemplary embodiment, the first surface 1 may be a mounting surface.

In addition, the dielectric layer 111 may include a ceramic material having a high dielectric constant, for example, a barium titanate ($BaTiO_3$)-based ceramic powder, or the like, but the present disclosure is not limited thereto.

The $BaTiO_3$-based ceramic powder may be, for example, $(Ba_{1-x}Ca_x)TiO_3$ ($0 \leq x \leq 0.9$), $Ba(Ti_{1-y}Ca_y)O_3$($0 \leq y \leq 0.9$), $(Ba_{1-x}Ca_x)(Ti_{1-y}Zr_y)O_3$ ($0 \leq x \leq 0.9$ and $0 \leq y \leq 0.9$), $Ba(Ti_{1-y}Zr_y)O_3$ ($0 \leq y \leq 0.9$), $Ba(Ti_{1-y}Zr_y)O_3$($0 \leq y \leq 0.9$), or the like, in which Ca, Zr, or the like is partially solid-dissolved in $BaTiO_3$, and the present disclosure is not limited thereto.

In addition, a ceramic additive, an organic solvent, a plasticizer, a binder, a dispersant, and the like may further be added to the dielectric layer 111, together with the ceramic powder. The ceramic additive may be, for example, a transition metal oxide or a transition metal carbide, a rare earth element, magnesium (Mg), aluminum (Al), or the like.

The first and second internal electrodes 121 and 122 are electrodes having different polarities, may be disposed alternately with the dielectric layer 111 interposed therebetween, and one ends of the first and second internal electrodes may be exposed through the third and fourth surfaces 3 and 4 of the capacitor body 110, respectively.

At this time, the first and second internal electrodes 121 and 122 may be electrically insulated from each other by a dielectric layer 111 disposed in the middle.

End portions of the first and second internal electrodes 121 and 122 alternately exposed through the third and fourth surfaces 3 and 4 of the capacitor body 110 may be respectively connected to the first and second connection portions of the first and second external electrodes 131 and 132 disposed on the third and fourth surfaces 3 and 4 of the capacitor body 110, described below, to be electrically connected.

At this time, the first and second internal electrodes 121 and 122 may be formed of a conductive metal such as nickel (Ni), a nickel (Ni) alloy, or the like, but the present disclosure is not limited thereto.

According to such a configuration, when a predetermined voltage is applied to the first and second external electrodes 131 and 132, charges are accumulated between the first and second internal electrodes 121 and 122 opposing each other.

At this time, the capacitance of the multilayer electronic component 100 may be proportional to an area of overlap of the first and second internal electrodes 121 and 122 in the Z direction.

The first and second external electrodes 131 and 132 are provided with voltages of different polarities, and may be respectively connected to exposed portions of the first and second internal electrodes 121 and 122 to be electrically connected thereto.

A plating layer may be formed on the surfaces of the first and second external electrodes 131 and 132, as required.

For example, the first and second external electrodes 131 and 132 may include first and second conductive layers, first and second nickel (Ni) plating layers formed on the first and second conductive layers, and first and second tin (Sn) plating layers formed on the first and second plating layers, respectively.

The first external electrode 131 may include a first connection portion 131a and a first band portion 131b.

The first connection portion 131a may be formed on the third surface 3 of the capacitor body 110 and connected to an exposed portion of the first internal electrode 121, and the first band portion 131b may extend from the first connection portion 131a onto a portion of the first surface 1, a mounting surface of the capacitor body 110, such that a first connection terminal 140 may be connected thereto. Therefore, the first connection terminal 140 may be formed on the first connection portion 131b extending from the first connection portion 131a onto a portion of the first surface 1.

At this time, the first band portion 131b may be extended to a portion of the second surface 2 and portions of the fifth and sixth surfaces 5 and 6 of the capacitor body 110 for the purpose of improving fixing strength, or the like.

The second external electrode 132 may include a second connection portion 132a and a second band portion 132b.

The second connection portion 132a is formed on the fourth surface 4 of the capacitor body 110 and is connected to an exposed portion of the second internal electrode 122, and the second band portion 132b may extend from the second connection portion 132a to a portion of the first surface, a mounting surface of the capacitor body 110, such that the second connection terminal 150 is connected thereto. Therefore, the second connection terminal 150 may be formed on the first connection portion 132b extending from the first connection portion 132a onto a portion of the first surface 1.

At this time, the second band portion 132b may be extended to a portion of the second surface and portions of the fifth and sixth surfaces 5 and 6 of the capacitor body 110, for the purpose of fixing strength, or the like, as required.

The first connection terminal 140 may be made of a conductor or an insulator.

When the first connection terminal 140 is made of an insulator, the insulator may be made of a ceramic material such as FR-4, F-PCB and alumina.

In addition, when the first connection terminal 140 is made of an insulator, the first connection terminal 140 may further include one or more conductive portions.

The conductive portions of the first connection terminal 140 may include a first connection surface facing the first band portion 131b of the first external electrode 131 on the first surface of the capacitor body 110, a second connection surface opposed to the first connection surface in the Z direction, and a first circumferential surface connecting the first and second connection surfaces.

At this time, the conductive portion may be formed on all or only a portion of the first circumferential surface of the first connection terminal 140.

When the first connection terminal 140 is made of a conductor, a surface of the first connection terminal 140 may be plated with tin (Sn) or gold (Au).

At this time, the first connection terminal 140 may have a symmetrical shape in X and Y directions and preferably have a rectangular shape.

In addition, an area of the first connection terminal 140 in the X-Y direction may be formed to be smaller than an area of the first band portion 131b in the X-Y direction.

At this time, a connection surface of the first connection terminal 140 connected to the first band portion 131b and the first band portion 131b of the first external electrode 131 may be bonded to each other by a solder or a conductive paste.

In addition, the first connection terminal 140 may be provided with one or more solder receiving portions serving as a solder pocket so as to have a symmetrical shape in the X and Y directions. The solder receiving portions are therefore designed to receive and hold one or more of solder masses.

In the present exemplary embodiment, the first connection terminal 140 may have a first solder receiving portion 141 formed on an outer surface in the X direction and a third solder receiving portion 142 formed on a surface opposite to the surface on which the first solder receiving portion 141 is formed in the X direction.

At this time, the first and third solder receiving portions 141 and 142 may be formed in a shape of a cutout portion having a short length in the X direction and a long length in the Y direction.

The volumes of the solder receiving portions as the solder pocket may be significantly increased to increase the capacity of the solder when mounted on the substrate, thereby improving the acoustic noise reduction effect.

The second connection terminal 150 may be made of a conductor or an insulator.

When the second connection terminal 150 may be made of an insulator, the insulator may be made of ceramic material such as FR-4, F-PCB and alumina.

In addition, when the second connection terminal 150 may be made of an insulator, the second connection terminal 150 may further include conductive portions.

The conductive portions of the second connection terminal 150 may include a third connection surface facing the second band portion 132b of the second external electrode 132 on the first surface side of the capacitor body 110, a fourth connection surface opposed to the third connection surface in the Z direction, and a second circumferential surface connecting the third and fourth connection surfaces.

At this time, the conductive portion may be formed on all or only a portion of the second circumferential surface of the second connection terminal 150.

When the second connection terminal 150 is made of a conductor, a surface of the second connection terminal 150 may be plated with tin (Sn) or gold (Au).

At this time, the second connection terminal 150 may have a symmetrical shape in X and Y directions, and may preferably have a rectangular shape.

In addition, an area of the second connection terminal 150 in the X-Y direction may be formed to be smaller than an area of the first band portion 132b in the X-Y direction.

At this time, a connection surface of the second connection terminal 150 connected to the second band portion 132 and the second band portion 132b of the second external electrode 132 may be bonded to each other by a solder or a conductive paste.

In addition, the second connection terminal 150 may be provided with one or more solder receiving portions serving as a solder pocket so as to have a symmetrical shape in the X and Y directions. The solder receiving portions are therefore designed to receive and hold one or more of solder masses.

In the present exemplary embodiment, the second connection terminal 150 has a second solder receiving portion 151 formed on an outer surface in the X direction and a fourth solder receiving portion 152 formed on a surface opposite to the surface on which the second solder receiving portion 151 may be formed in the X direction.

At this time, the second solder receiving portion 151 may be formed on a surface opposite to the first solder receiving portion 141 to each other, and the fourth solder receiving portion 152 is formed on a surface facing each other the third solder receiving portion 142 in the X direction.

At this time, the second and fourth solder receiving portions 151 and 152 may be formed in a shape of a cutout portion having a short length in the X direction and a long length in a Y direction.

Accordingly, volumes thereof as the solder pocket may be significantly increased to increase the capacity of the solder when mounted on the substrate, thereby improving the acoustic noise reduction effect.

When the first and second connection terminals 140 and 150 may be formed of an insulator which may be made of soft material, piezoelectric vibrations transmitted to the substrate through the first and second external electrodes 131 and 132 of the multilayer electronic component 100 is absorbed through elasticity of the first and second connection terminals 140 and 150, thereby reducing the acoustic noise.

When a voltage having different polarities is applied to the first and second external electrodes 131 and 132 formed on the multilayer electronic component 100 in a state in which the multilayer electronic component 100 is mounted on the substrate, the capacitor body 110 expands and contracts in the thickness direction by an inverse piezoelectric effect of the dielectric layer 111, and both end portions of the first and second external electrodes 131 and 132 contract and expand in an inverse manner to the expansion and contraction of the capacitor body 110 in the thickness direction by a Poisson effect.

Such contraction and expansion cause vibrations. In addition, the vibrations may be transmitted to the substrate from the first and second external electrodes 131 and 132, such that sound is radiated from the substrate to become acoustic noise.

As in the present exemplary embodiment, when the first and third solder receiving portions 141 and 142 may be formed on both surfaces of the first connection terminal 140 in the X direction, respectively, and the second and fourth solder receiving portions 151 and 152 are formed on both surfaces of the second connection terminal 150 in the X direction, respectively, the first and fourth solder receiving portions serve as solder pockets.

When the multilayer electronic component is mounted on the substrate, the solder may be trapped in the first band portion 131b of the first external electrode 131 which are not connected to the first connection terminal 140, and the solder may be trapped in the second band portion 132b of the second external electrode 132 which are not connected to the second connection terminal 150, on the first surface of the capacitor body 110.

Therefore, a formation height of a solder fillet may be suppressed.

Therefore, a path through which the piezoelectric vibrations of the multilayer electronic component 100 are transmitted to the substrate may be blocked and the maximum displacement points in the solder fillet in the capacitor body 110 may be spaced apart from each other, thereby greatly improving the acoustic noise reduction effect of the multilayer electronic component 100.

On the other hand, in the present exemplary embodiment, the first connection terminal 140 and the second connection terminal 150 may have a symmetrical shape in X and Y directions. Accordingly, when attaching the first and second connection terminals 140 and 150 to the multilayer capacitor, a position alignment and a direction alignment may be easily performed, thereby improving the manufacturing processability of the multilayer electronic component.

In addition, a plurality of solder receiving portions may be formed symmetrically with respect to the X direction and the Y direction, respectively, such that a contact surface of the solder at the time of mounting on the substrate is significantly increased, thereby improving the fixing strength between the multilayer electronic component and the substrate.

According to the present exemplary embodiment, an amount of vibration in which the piezoelectric vibrations of the multilayer electronic component is transmitted to the substrate at the audible frequency within 20 kHz may be effectively suppressed, by the acoustic noise reduction structure.

Therefore, the high frequency vibrations of the multilayer electronic component may be reduced to prevent malfunction of sensors which may be a problem due to high frequency vibrations of 20 kHz or more of the electronic products in IT or industrial/electric fields, and to suppress internal fatigue accumulation due to long-time vibrations of the sensors.

Figure 4:
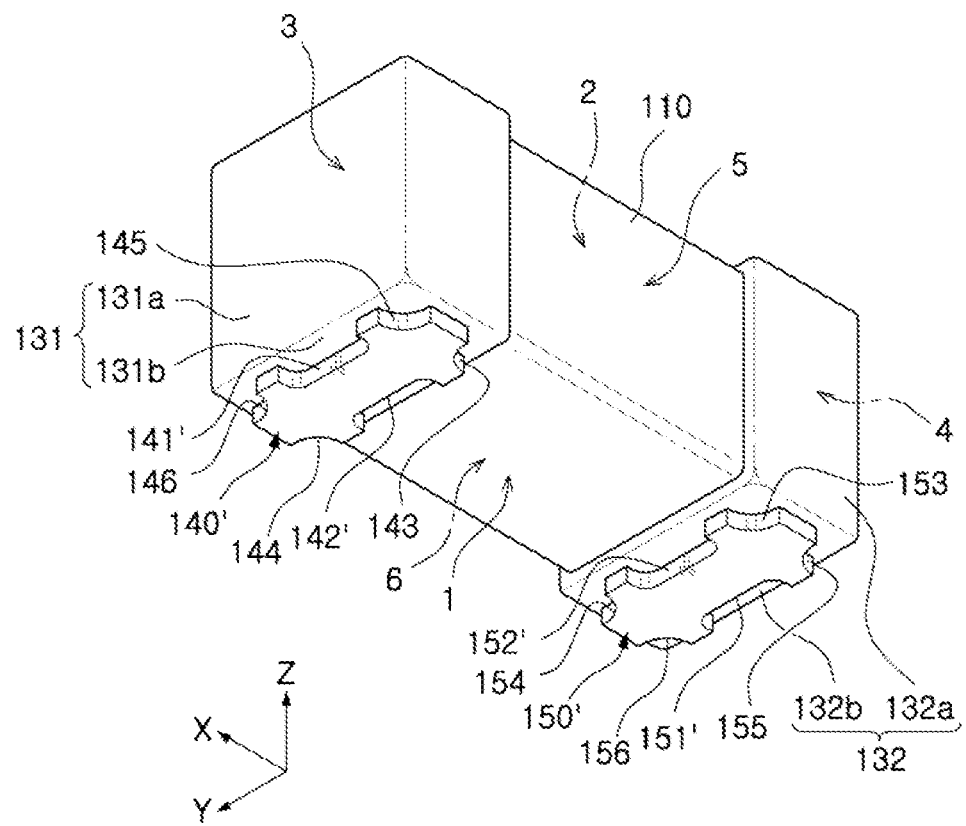
FIG. 4 is a perspective view illustrating a modified example of first and second connection terminals in FIG. 1.

FIG. 4 is a perspective view illustrating a modified example of the first and second connection terminals in FIG. 1.

Referring to FIG. 4, a first connection terminal 140' of the present exemplary embodiment may be formed to have a rectangular shape, and solder receiving portions 143, 144, 145, and 146 may be formed in four corners of the first connection terminal 140', respectively. The shape of the first connection terminal 140' is not limited to this embodiment and includes a square shape, a round shape, and an oval shape and the like.

In an exemplary embodiment, each of the first and third solder receiving portions 141' and 142', which have additional solder receiving portions 143, 144, 145, and 146, may be smaller than the first and third solder receiving portions 141 and 142 described above, which do not have additional solder receiving portions in the four corners of the first connection terminal 140, respectively.

A second connection terminal 150' may be formed to have a rectangular shape, and solder receiving portions 153, 154, 155, 156 may be formed in four corners of the second connection terminal 150, respectively.

In an exemplary embodiment, each of the second and fourth solder receiving portions 151' and 152', which have additional solder receiving portions 153, 154, 155, and 156, may be smaller than the second and fourth receiving portions 151 and 152 described above, which do not have additional solder receiving portions in the four corners of the second connection terminal 150, respectively.

In addition, the sizes and shapes of the solder receiving portions formed in the first connection terminal 140' and the sizes and shapes of the solder receiving portions formed in the second connection terminal 150' may be substantially the same. In one embodiment, the sizes and shapes of the solder receiving portions formed in the first connection terminal 140' and the sizes and shapes of the solder receiving portions formed in the second connection terminal 150' may be different each other.

The first and second connection terminals 140' and 150' as configured above may further increase the volume of the solder receiving portion to further increase the capacity of the solder at the time of mounting on the substrate, thereby further reducing the acoustic noise.

Figure 5:
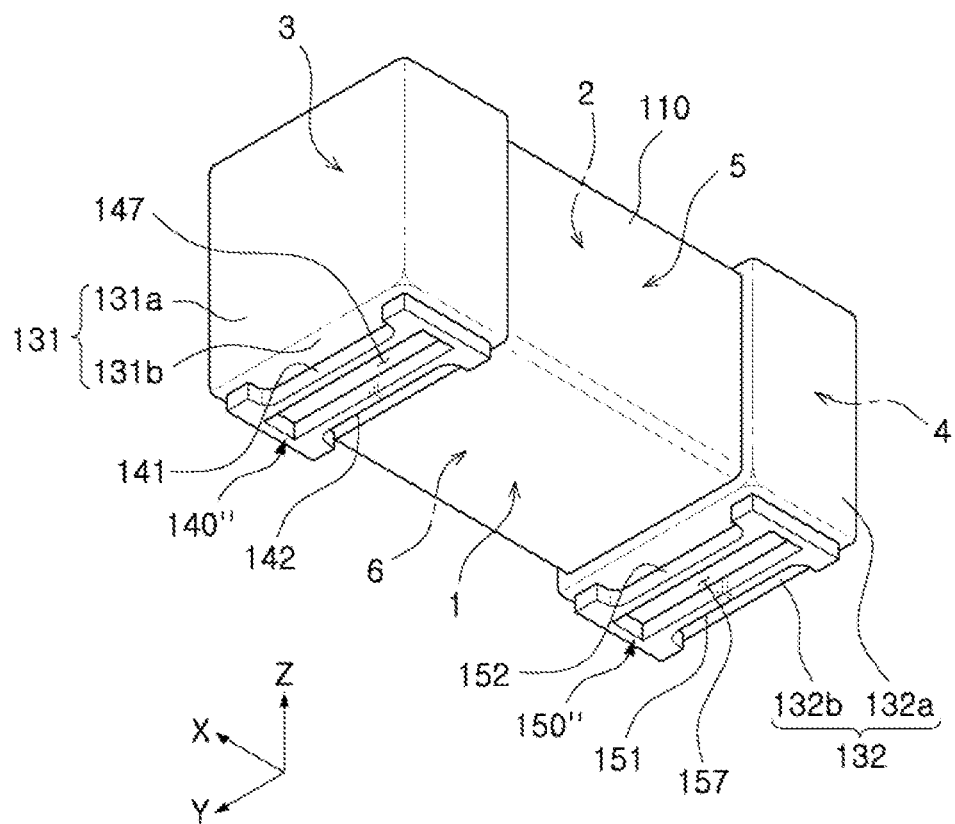
FIG. 5 is a perspective view illustrating another modified example of first and second connection terminals in FIG. 1.

FIG. 5 is a perspective view illustrating another embodiment of the present invention in which the first and second connection terminals 140 and 150 in FIG. 1 are modified.

Referring to FIG. 5, a first connection terminal 140" may have a space portion 147 therein.

The first space portion 147 may be provided by removing a central portion while leaving a rim of the first connection terminal 140".

At this time, the first space portion 147 may be formed as a long groove along the Y direction.

The second connection terminal 150" may have a second space portion 157 therein.

The second space portion 157 may be provided by removing a central portion while leaving a rim of the second connection terminal 150".

At this time, the second space portion 157 may be formed as a long groove along the Y direction.

The first and second connection terminals 140" and 150" configured as above may be provided with the first and second spacing portions 147 and 157 at central portions, respectively, such that a solder pocket may be formed over a wider area without any problems in current carrying with the multilayer capacitor and the substrate.

Therefore, when the multilayer electronic component is mounted on a substrate, a larger amount of solders may be trapped in the first and second space portions 147 and 157 to effectively lower the height of the solder fillet, thereby improving the acoustic noise reduction effect.

Figure 6:
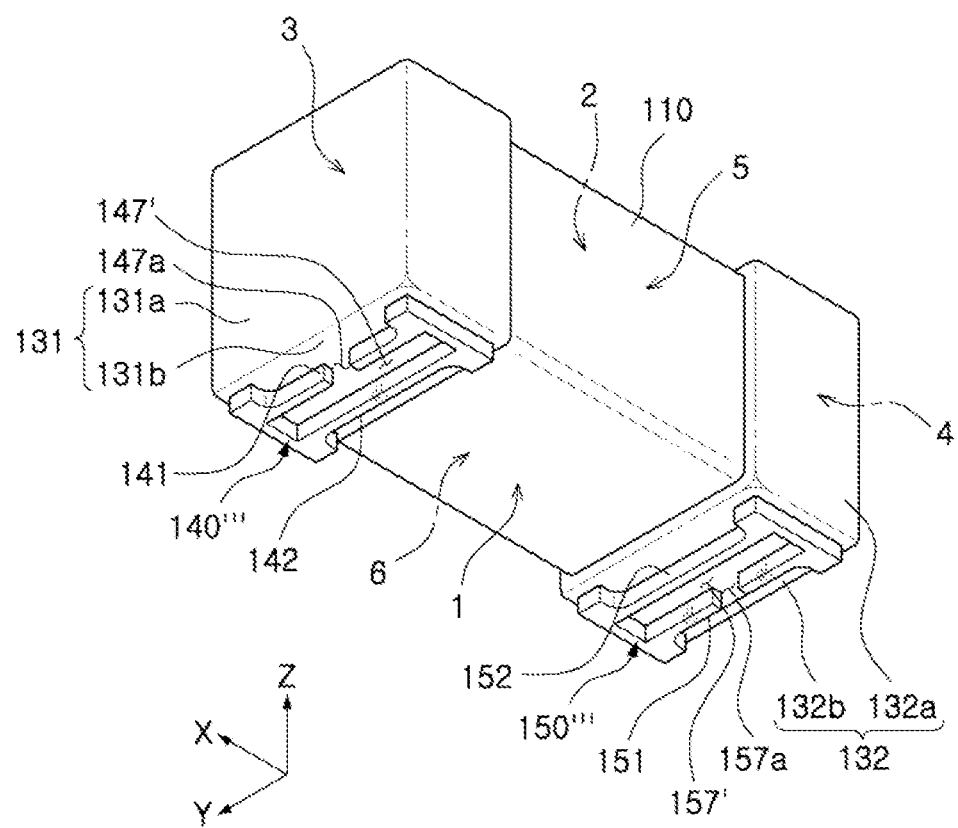
FIG. 6 is a perspective view illustrating another modified example of first and second connection terminals in FIG. 1.

FIG. 6 is a perspective view illustrating another modified example of the first and second connection terminals in FIG. 1.

Referring to FIG. 6, a first cutout portion 147a is formed in the first connection terminal 140'' such that a portion of the first space portion 147' are exposed to the first solder receiving portion 141.

In addition, a second cutout portion 157a is formed in the second connection terminal 150''' such that a portion of the second space portion 157' are exposed to the second solder receiving portion 151.

At this time, the first cutout portion 147a and the second cutout portion 157a may be formed in positions corresponding to each other in the Y direction.

The first and second cutout portions 147a and 157a serve as paths for introducing the solder into the first and second space portions 147' and 157', such that it may be expected that a larger amount of solders are trapped in the first and second space portions 147' and 157'.

As set forth above, according to an exemplary embodiment in the present disclosure, the acoustic noise of the multilayer electronic component and high frequency vibration of 20 kHz or more may be reduced.

While exemplary embodiments have been shown and described above, it will be apparent to those skilled in the art that modifications and variations could be made without departing from the scope of the present invention as defined by the appended claims.

What is claimed is:

1. A multilayer electronic component comprising:
a capacitor body including a plurality of dielectric layers and a plurality of first and second internal electrodes alternately disposed with the dielectric layer therebetween, and having first and second surfaces opposing each other, third and fourth surfaces connected to the first and second surfaces and opposing each other, and fifth and sixth surfaces connected to the first and second surfaces, connected to the third and fourth surfaces and opposing each other, one ends of the first and second internal electrodes being exposed through the third and fourth surfaces, respectively;
first and second external electrodes including first and second connection portions disposed on the third and fourth surfaces of the capacitor body, respectively, and first and second band portions extending from the first and second connection portions to a portion of the first surface of the capacitor body, respectively; and
first and second connection terminals disposed on the first and second band portions on the first surface of the capacitor body, respectively,
wherein the first and second connection terminals have at least one solder receiving portion having a symmetrical shape in a direction connecting the third and fourth surfaces and a direction connecting the fifth and sixth surfaces, and
wherein the at least one solder receiving portion includes a recessed side surface.

2. The multilayer electronic component of claim 1, wherein the first and second connection terminals comprise:
first and second solder receiving portions respectively formed on both surfaces opposing each other in a direction connecting the third and fourth surfaces of the capacitor body; and
third and fourth solder receiving portions respectively formed on both surfaces opposite to the surfaces on which the first and second solder receiving portions are formed in.

3. The multilayer electronic component of claim 1, wherein the first and second connection terminals are a rectangular shape and have additional solder receiving portions in four corners of the first and second connection terminals, respectively.

4. The multilayer electronic component of claim 1, wherein the first and second connection terminals further comprise first and second space portions respectively formed therein.

5. The multilayer electronic component of claim 2, wherein the first and second connection terminals comprise first and second space portions respectively formed therein;
a first cutout portion formed in such a manner that a portion of the first space portion is exposed to the first solder receiving portion; and
a second cutout portion formed in such a manner that a portion of the second space portion is exposed to the second solder receiving portion.

6. The multilayer electronic component of claim 5, wherein the first cutout portion and the second cutout portion are formed in positions corresponding to each other in a direction connecting the fifth and sixth surfaces of the capacitor body.

7. The multilayer electronic component of claim 2, wherein the first and second connection terminals are a rectangular shape and have additional solder receiving portions in four corners of the first and second connection terminals, respectively.

8. The multilayer electronic component of claim 2, wherein the first and second connection terminals further comprise first and second space portions respectively formed therein.

9. The multiple electronic component of claim 1, wherein the first and second connection terminals are made of a conductor.

10. The multiple electronic component of claim 1, wherein the first and second connection terminals are made of an insulator.

11. The multiple electronic component of claim 10, wherein the first and second connection terminals further include one or more conductive portions.

12. The multiple electronic component of claim 11, wherein each of the conductive portions of the first and second connection terminals include:
a first connection surface facing the first and second band portions of the first and second external electrodes on the first surface of the capacitor body;
a second connection surface opposed to the first connection surface; and
a first circumferential surface connecting the first and second connection surfaces.

13. A multilayer electronic component comprising:
a capacitor body including a plurality of dielectric layers and a plurality of first and second internal electrodes alternately disposed with the dielectric layer therebetween, and having first and second surfaces opposing each other, third and fourth surfaces connected to the first and second surfaces and opposing each other, and fifth and sixth surfaces connected to the first and second surfaces, connected to the third and fourth surfaces and opposing each other, one ends of the first and second internal electrodes being exposed through the third and fourth surfaces, respectively;

first and second external electrodes including first and second connection portions disposed on the third and fourth surfaces of the capacitor body, respectively, and first and second band portions extending from the first and second connection portions to a portion of the first surface of the capacitor body, respectively; and first and second connection terminals disposed on the first and second band portions on the first surface of the capacitor body, respectively, wherein the first and second connection terminals have at least one solder receiving portion having a symmetrical shape in a direction connecting the third and fourth surfaces and a direction connecting the fifth and sixth surfaces, and wherein the first and second connection terminals are a rectangular shape and have additional solder receiving portions in four corners of the first and second connection terminals, respectively.

14. A multilayer electronic component comprising:

a capacitor body including a plurality of dielectric layers and a plurality of first and second internal electrodes alternately disposed with the dielectric layer therebetween, and having first and second surfaces opposing each other, third and fourth surfaces connected to the first and second surfaces and opposing each other, and fifth and sixth surfaces connected to the first and second surfaces, connected to the third and fourth surfaces and opposing each other, one ends of the first and second internal electrodes being exposed through the third and fourth surfaces, respectively;

first and second external electrodes including first and second connection portions disposed on the third and fourth surfaces of the capacitor body, respectively, and first and second band portions extending from the first and second connection portions to a portion of the first surface of the capacitor body, respectively; and first and second connection terminals disposed on the first and second band portions on the first surface of the capacitor body, respectively, wherein the first and second connection terminals have at least one solder receiving portion having a symmetrical shape in a direction connecting the third and fourth surfaces and a direction connecting the fifth and sixth surfaces, and wherein the first and second connection terminals further comprise first and second space portions respectively formed therein.

* * * * *